United States Patent
Kaneda et al.

(10) Patent No.: US 10,205,013 B2
(45) Date of Patent: Feb. 12, 2019

(54) SEMICONDUCTOR SWITCHING ELEMENT AND METHOD OF MANUFACTURING THE SAME

(71) Applicant: Mitsubishi Electric Corporation, Tokyo (JP)

(72) Inventors: Mitsuru Kaneda, Tokyo (JP); Tetsuo Takahashi, Tokyo (JP); Kenji Suzuki, Tokyo (JP); Ryu Kamibaba, Tokyo (JP); Mariko Umeyama, Tokyo (JP); Koichi Nishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/844,659

(22) Filed: Dec. 18, 2017

(65) Prior Publication Data

US 2018/0308963 A1    Oct. 25, 2018

(30) Foreign Application Priority Data

Apr. 21, 2017 (JP) ................ 2017-084205

(51) Int. Cl.
  *H01L 29/739* (2006.01)
  *H01L 29/66* (2006.01)
  (Continued)

(52) U.S. Cl.
  CPC ...... *H01L 29/7397* (2013.01); *H01L 29/0696* (2013.01); *H01L 29/0804* (2013.01);
  (Continued)

(58) Field of Classification Search
  None
  See application file for complete search history.

(56) References Cited

U.S. PATENT DOCUMENTS 5,525,821 A * 6/1996 Harada .............. H01L 29/0619
                                              257/331
8,178,947 B2 * 5/2012 Takahashi .......... H01L 29/7397
                                              257/133
(Continued)

FOREIGN PATENT DOCUMENTS

EP       1 713 128 B1      7/2011
JP     2006-295014 A      10/2006
(Continued)

OTHER PUBLICATIONS

Zhu, Chunlin, et al. "A Floating Dummy Trench Gate IGBT (FDT-IGBT) for Hybrid and Electric Vehicle (HEV/EV) Applications." 2017 19th European Conference on Power Electronics and Applications (EPE'17 ECCE Europe), 2017, doi:10.23919/epe17ecceeurope.2017.8099106.*

(Continued)

*Primary Examiner* — Joseph Schoenholtz
(74) *Attorney, Agent, or Firm* — Studebaker & Brackett PC

(57) ABSTRACT

A semiconductor switching element includes a first gate electrode and a second gate electrode. The first gate electrode is disposed, via a first gate insulating film, inside a first trench that extends from an upper surface of an emitter region to reach a semiconductor layer, and intersects with the emitter region, a base region, and a charge storage layer. The second gate electrode is disposed, via a second gate insulating film, inside a second trench that extends from the upper surface of the emitter region and an upper surface of a conductive region to reach the semiconductor layer, and is adjacent to the emitter region, the base region, the charge storage layer, and the conductive region. The second trench is smaller in depth than the first trench, and the second trench is smaller in width than the first trench.

4 Claims, 20 Drawing Sheets

(51) Int. Cl.
    *H01L 29/10*    (2006.01)
    *H01L 29/423*   (2006.01)
    *H01L 29/08*    (2006.01)
    *H01L 29/06*    (2006.01)
(52) U.S. Cl.
    CPC ...... *H01L 29/0821* (2013.01); *H01L 29/1004* (2013.01); *H01L 29/4236* (2013.01); *H01L 29/66348* (2013.01)

(56) References Cited

U.S. PATENT DOCUMENTS

| | | |
|---|---|---|
| 8,604,544 B2 | 12/2013 | Matsushita |
| 9,306,048 B2 | 4/2016 | Blanchard et al. |
| 9,929,260 B2* | 3/2018 | Naito ................ H01L 29/7397 |
| 2003/0080379 A1* | 5/2003 | Oikawa ............. H01L 29/4236 257/331 |
| 2008/0164516 A1* | 7/2008 | Darwish ............ H01L 29/0649 257/329 |
| 2009/0020852 A1* | 1/2009 | Harada ............. H01L 29/0696 257/579 |
| 2009/0283797 A1* | 11/2009 | Takahashi ........... H01L 29/7397 257/139 |
| 2010/0308401 A1* | 12/2010 | Narazaki ............ H01L 29/7397 257/330 |
| 2014/0091855 A1 | 4/2014 | Blanchard et al. |
| 2015/0303288 A1* | 10/2015 | Hashimoto ......... H01L 29/7397 363/131 |
| 2017/0025522 A1 | 1/2017 | Naito |
| 2017/0084610 A1* | 3/2017 | Kouno ................ H01L 29/1095 |
| 2018/0108738 A1* | 4/2018 | Naito ................. H01L 29/1095 |

FOREIGN PATENT DOCUMENTS

| | | |
|---|---|---|
| JP | 2011-204803 A | 10/2011 |
| JP | 2014-063961 A | 4/2014 |

OTHER PUBLICATIONS

Mori, M.., et al. "A Trench-Gate High-Conductivity IGBT (HiGT) With Short-Circuit Capability." IEEE Transactions on Electron Devices, vol. 54, No. 8, 2007, pp. 2011-2016., doi:10.1109/ted.2007.900007.*

* cited by examiner

F I G. 3
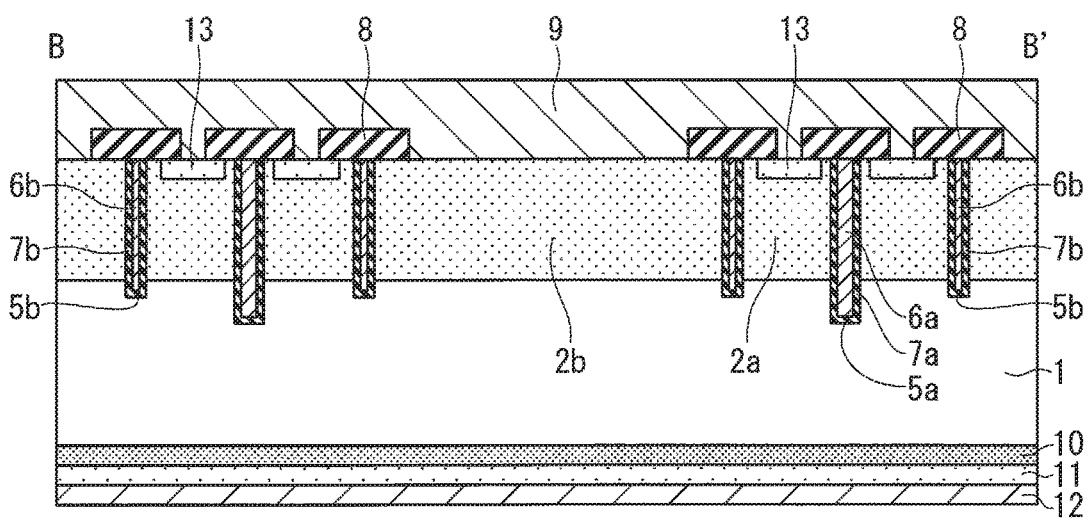

F I G. 14A
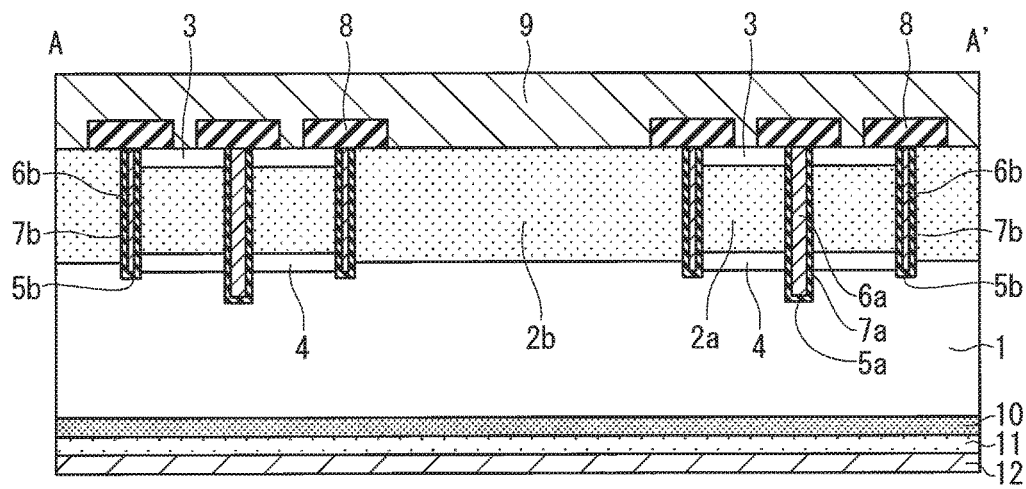
F I G. 14B
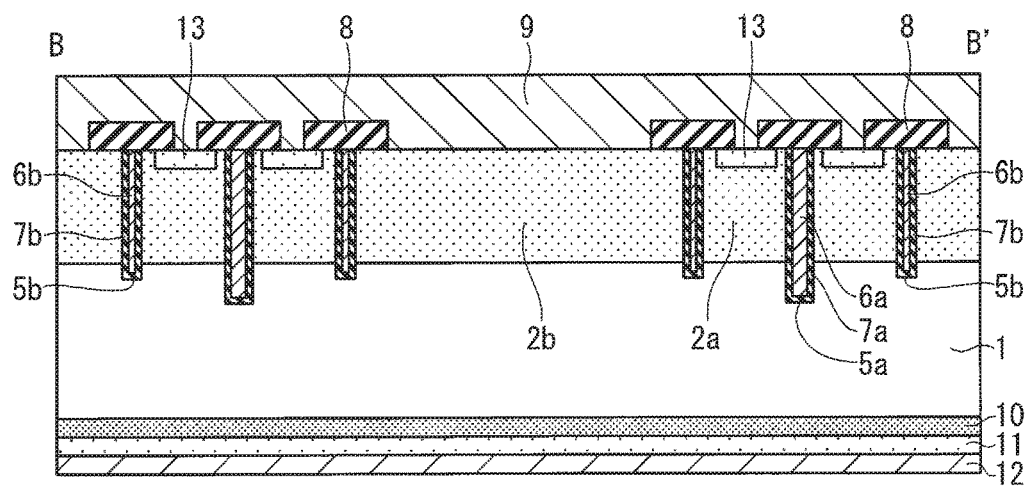

SEMICONDUCTOR SWITCHING ELEMENT AND METHOD OF MANUFACTURING THE SAME

BACKGROUND OF THE INVENTION

Field of the Invention

The present invention relates to a semiconductor switching element and a method of manufacturing the same.

Description of the Background Art

In recent years, inverter circuits have been widely used for controlling home appliances, industrial electric power apparatuses and the like in view of energy conservation. In an inverter circuit, a power semiconductor device including a semiconductor switching element repeatedly turns ON and OFF voltage or current, thereby exerting power control. With a rated voltage of 300 V or greater, an insulated gate bipolar transistor (hereinafter abbreviated as the "IGBT") is mainly employed as a semiconductor switching element for its characteristics.

Meanwhile, in relation to the IGBT, with a structure in which emitter regions and trench-type gate electrodes are evenly provided, the element may be short-circuited due to any malfunction. In this case, an enormous amount of current flows and affects the element. Accordingly, for example, Japanese Patent Application Laid-Open Nos. 2011-204803 and 2014-063961 each show a structure in which emitter regions and trench-type gate electrodes are partially omitted so as to suppress current in the event of short-circuiting of the element.

However, as described above, there has been a problem that, with the structure in which a charge storage layer capable of reducing ON resistance is provided to an entire structure in which a trench-type gate electrode is not provided at a portion with no emitter region, when the element is interrupted and voltage is applied, the charge storage layer fails to be depleted and breakdown voltage reduces.

SUMMARY

The present invention has been made in view of the above-described problem, and an object thereof is to provide a technique capable of suppressing a reduction in breakdown voltage.

The present invention provides a semiconductor switching element including a semiconductor layer, a charge storage layer, a base region, an emitter region, a conductive region, a first gate electrode, and a second gate electrode. The semiconductor layer is a first conductivity type. The charge storage layer is disposed on a first plane in an upper surface of the semiconductor layer. The base region is a second conductivity type and disposed on the charge storage layer. The emitter region is the first conductivity type and disposed on the base region. The conductive region is the second conductivity type and disposed on a second plane in the upper surface of the semiconductor layer. The first gate electrode is disposed, via a first gate insulating film, inside a first trench that extends from an upper surface of the emitter region to reach the semiconductor layer, and intersects with the emitter region, the base region, and the charge storage layer. The second gate electrode is disposed, via a second gate insulating film, inside a second trench that extends from the upper surface of the emitter region and an upper surface of the conductive region to reach the semiconductor layer, and is adjacent to the emitter region, the base region, the charge storage layer, and the conductive region. The second trench is smaller in depth than the first trench, and the second trench is smaller than in width than the first trench.

A reduction in breakdown voltage can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a section view taken along line B-B' showing the structure of the semiconductor switching element according to the first preferred embodiment;

FIGS. 4A to 14B are each a section view showing a method of manufacturing the semiconductor switching element according to the first preferred embodiment;

DESCRIPTION OF THE PREFERRED EMBODIMENTS

In the following, with reference to the drawings, a description will be given of preferred embodiments. Note that, the drawings are schematically illustrated. The mutual relationship in size and position between constituents appearing in different drawings is not necessarily in the strict sense and may be changed as appropriate.

<First and Second Related Semiconductor Switching Elements>

Firstly, prior to describing a semiconductor switching element according to a first preferred embodiment of the present invention, a description will be given of first and second semiconductor switching elements related thereto (hereinafter referred to as the "first and second related semiconductor switching elements").

Figure 22:
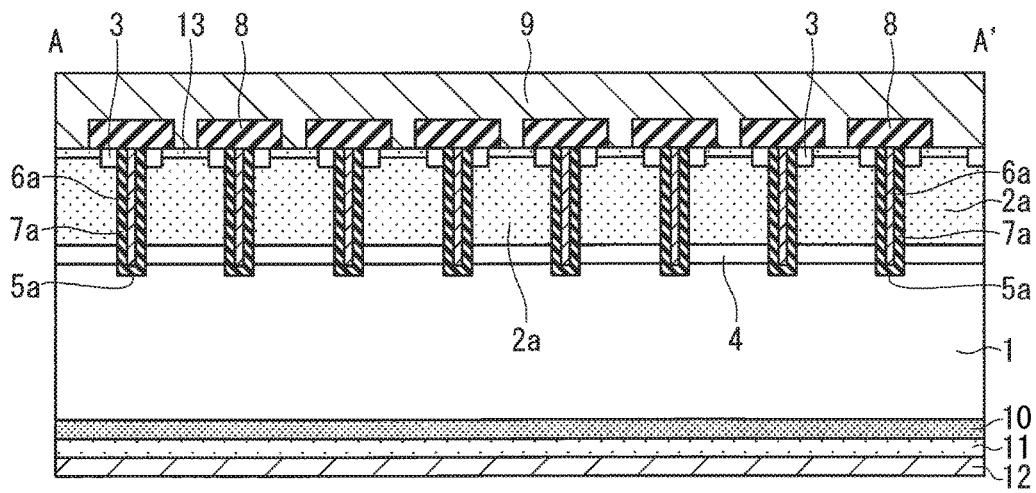
FIG. 22 is a section view showing the structure of a first related switching element.

FIG. 22 is a section view showing the structure of the first related switching element. The first related switching element is a carrier stored insulated gate bipolar transistor. Hereinafter, while the description is given based on that the first conductivity type is N-type and the second conductivity type is P-type, the first conductivity type may be P-type and the second conductivity type may be N-type. Note that, N-type includes N⁻-type and N-type, and P-type includes P⁻-type and P⁺-type.

The first related switching element includes a semiconductor layer 1 being N⁻-type, base regions 2a being P-type, emitter regions 3 being N-type, a charge storage layer 4, first trenches 5a, first gate electrodes 6a, first gate oxide films 7a being each a first gate insulating film, insulating films 8, an emitter electrode 9, a buffer region 10 being N-type, a collector region 11 being P-type, a collector electrode 12, and a high-concentration region 13 being P⁺-type.

On the cell region at the upper surface of the semiconductor layer 1, the charge storage layer 4 is disposed. The charge storage layer 4 is, for example, an N-type impurity layer being higher in impurity concentration than the semiconductor layer 1, and is a layer for reducing ON resistance.

On the charge storage layer 4, the base regions 2a formed by a diffused P-type impurity are disposed. On the base region 2a, the emitter regions 3 formed by a selectively diffused high-concentration N-type impurity are disposed. Further, on the base regions 2a, the high-concentration regions 13 formed by a selectively diffused high-concentration P-type impurity are disposed adjacent to the emitter regions 3.

Each of the first trenches 5a that extends from the upper surface of the emitter region 3 to reach the semiconductor layer 1 is provided to intersect with the emitter region 3, the base region 2a and the charge storage layer 4. Herein, a plurality of first trenches 5a are provided at regular intervals in the horizontal direction, and the first trenches 5a are provided so as to be perpendicular to the emitter regions 3.

The first gate electrode 6a is disposed inside each first trench 5a via the first gate oxide film 7a. Here, the first gate electrode 6a is embedded in the first trench 5a. In each base region 2a interposed between the emitter region 3 and the semiconductor layer 1, the peripheral part of the first gate electrode 6a functions as a channel region.

Each of the insulating films 8 covers the upper surface of the first gate electrode 6a and the upper part around the first gate electrode 6a. The emitter electrode 9 covers the portion exposed outside the insulating film 8 in the high-concentration region 13 and the insulating film 8.

On the back surface of the semiconductor layer 1, the buffer region 10 formed with an N-type impurity is disposed. On the lower surface of the buffer region 10, the collector region 11 formed with a P-type impurity is disposed. Further, on the entire lower surface of the collector region 11, the collector electrode 12 is disposed.

Next, with reference to FIG. 22, a description will be given of ON operation of the first related switching element. It is assumed that, in the state where predetermined positive collector voltage $V_{CE}$ is applied across the emitter electrode 9 and the collector electrode 12, the gate is turned ON with predetermined positive gate voltage $V_{GE}$ being applied across the emitter electrode 9 and the first gate electrode 6a. Here, the channel region of each base region 2a is inverted from P-type to N-type, to form a channel. Through this channel, electrons are injected from the emitter electrode 9 into the semiconductor layer 1. By the injected electrons, the region between the collector region 11 and the semiconductor layer 1 enters the forward bias state, and positive holes (holes) are injected from the collector region 11 into the semiconductor layer 1. This largely reduces the resistance of the semiconductor layer 1. Because of a large reduction in ON resistance of the first related switching element, the current capacity increases. Further, by virtue of the charge storage layer 4 accumulating the positive holes supplied from the collector region 11 immediately under the charge storage layer 4, the effect of reducing ON resistance of the first related switching element further intensifies.

However, with the structure shown in FIG. 22 in which the emitter region 3 is disposed at every first trench 5a, the element may be short-circuited due to any malfunction. In this case, an enormous amount of current flows and affects the element.

Figure 23:
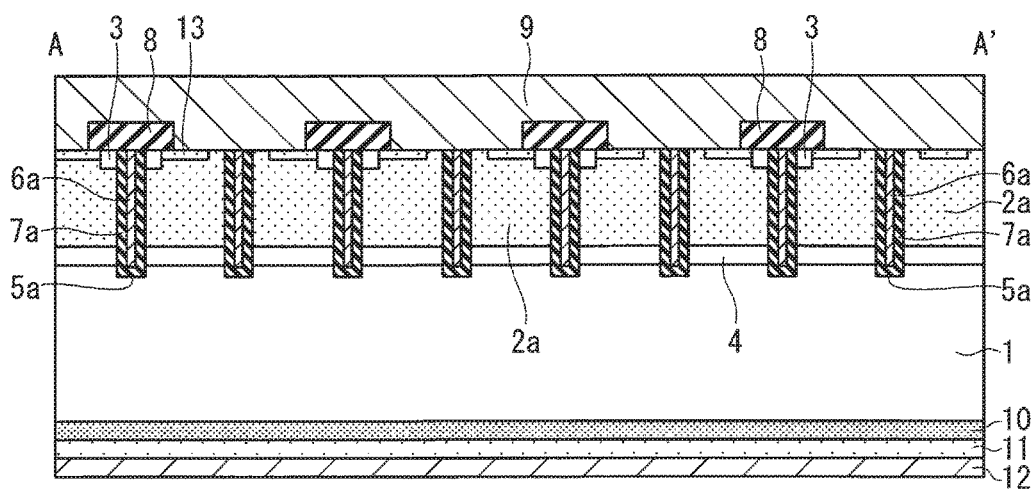
FIG. 23 is a section view showing the structure of a second related semiconductor switching element.

FIG. 23 is a section view showing the structure of a second related semiconductor switching element for solving the problem. The structure according to the second related semiconductor switching element corresponds to the first related switching element from which some of the emitter regions 3 are omitted. By partially omitting the emitter regions 3 within a range with a minimum increase in ON voltage, the current that flows upon short-circuiting of the element can be suppressed.

However, with such a structure, the first gate electrode 6a at the portion with no emitter region 3 becomes the parasitic capacitance of the element. In accordance with an increase in the input capacitance of the element attributed to the parasitic capacitance, unfortunately, the gate driving charges may increase or the switching speed may reduce.

Accordingly, Japanese Patent Application Laid-Open Nos. 2011-204803 and 2014-063961 each disclose the technique of partially omitting also the first gate electrode 6a. However, with a structure obtained by adding, to such a structure in its entirety, a charge storage layer capable of reducing ON resistance, there has been a problem that, when the element is interrupted and voltage is applied, the charge storage layer fails to be depleted and breakdown voltage reduces. A semiconductor switching element according to a first preferred embodiment of the present invention is capable of solving this problem.

<First Preferred Embodiment>

Figure 1:
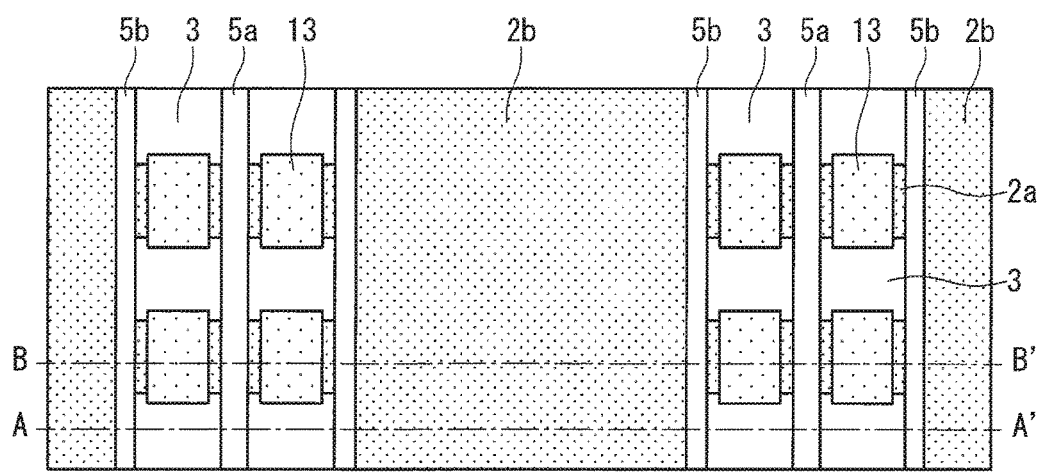
FIG. 1 is a plan view showing the structure of a semiconductor switching element according to a first preferred embodiment.
Figure 2:
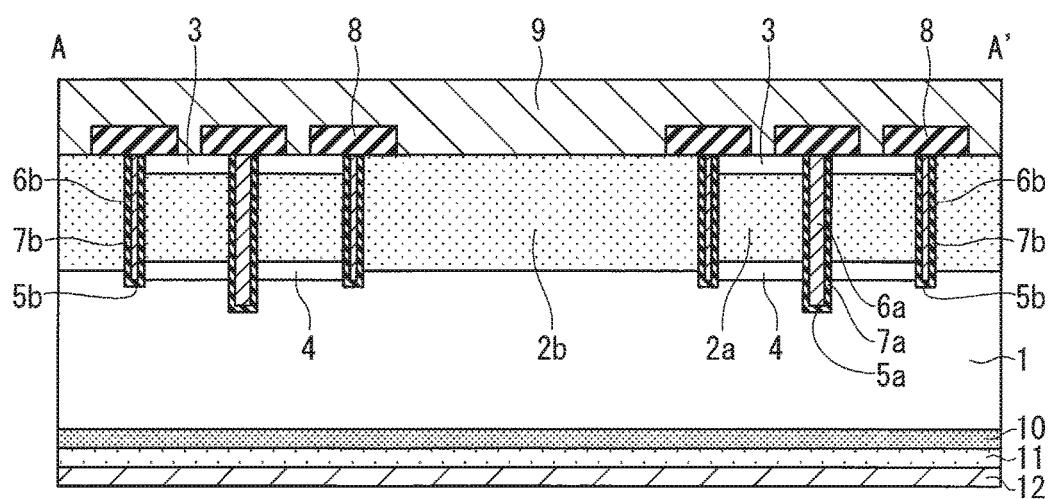
FIG. 2 is a section view taken along line A-A' showing the structure of a semiconductor switching element according to the first preferred embodiment.

FIG. 1 is a plan view of the structure showing the structure of a semiconductor switching element according to a first preferred embodiment of the present invention. FIGS. 2 and 3 are respectively section views taken along line A-A' arid line B-B' in FIG. 1. Note that, some of the constituents shown in FIGS. 2 and 3 are omitted in FIG. 1.

The semiconductor switching element according to the first preferred embodiment is a carrier stored insulated gate bipolar transistor, similarly to the first and second related semiconductor switching elements. Hereinafter, as to the constituents of the first preferred embodiment, those identical or similar to the above-described constituents are denoted by the identical reference characters, and the description will be mainly given of different constituents.

The semiconductor switching element according to the first preferred embodiment includes, in addition to the structure of the first related switching element, conductive regions 2b being P-type, second trenches 5b, second gate electrodes 6b, and second gate oxide films 7b each being the second gate insulating film.

As shown in FIG. 2, on a cell region being a first plane in the upper surface of the semiconductor layer 1, similarly to the first related switching element, the charge storage layer 4, the base region 2a, and the emitter region 3 are arranged in this order. Note that, while the position of the emitter region 3 and the position of the charge storage layer 4 in the depth direction are different, the pattern of the emitter region 3 in a plan view of FIG. 1 and the pattern of the charge storage layer 4 in a plan view in FIG. 1 are the same.

On a second plane in the upper surface of the semiconductor layer 1, the conductive region 2b is disposed. Inside the conductive region 2b, no first and second trenches 5a, 5b are provided.

As shown in FIG. 1, in the first preferred embodiment, a plurality of conductive regions 2b, a plurality of first trenches 5a, and a plurality of second trenches 5b are arranged in the horizontal direction in FIG. 2. Further, a plurality of emitter regions 3 are arranged in the vertical direction in FIG. 1 in which the first and second trenches 5a, 5b extend, and spaced apart from each other by the base regions 2a and the high-concentration regions 13. Note that, as shown in FIG. 3, the high-concentration regions 13 are disposed on the base regions 2a, respectively.

As shown in FIG. 2, each of the first trenches 5a extending from the upper surface of the emitter region 3 to reach the semiconductor layer 1 is provided so as to be perpendicular to, that is, to intersect with the emitter region 3, the base region 2a, and the charge storage layer 4.

Here, the semiconductor switching element according to the first preferred embodiment is provided with the second trenches 5b. Each of the second trenches 5b extends from the upper surface of the emitter region 3 and that of the conductive region 2b to reach the semiconductor layer 1. The second trenches 5b are each adjacent to the emitter region 3, the base region 2a, the charge storage layer 4, and the conductive region 2b. Each second trench 5b is smaller in depth than each first trench 5a, and each second trench 5b is smaller in width than each first trench 5a.

The first gate electrode 6a is disposed in each first trench 5a via the first gate oxide film 7a. Similarly, the second gate electrode 6b is disposed in each second trench 5b via the second gate oxide film 7b. Note that, the second gate electrode 6b is smaller in depth than the first gate electrode 6a. In each base region 2a interposed between the emitter region 3 and the semiconductor layer 1, the peripheral part of each of the first and second gate electrodes 6a, 6b functions as a channel region.

<Operation>

A description will be given of an operation of the semiconductor switching element according to the first preferred embodiment. In FIGS. 2 and 3, it is assumed that, in the state where predetermined positive collector voltage $V_{CE}$ is applied across the emitter electrode 9 and the collector electrode 12, the gate is turned ON with predetermined positive gate voltage $V_{GE}$ being applied across the emitter electrode 9 and the first gate electrodes 6a, and across the emitter electrode 9 and the second gate electrodes 6b. Here, the channel region of each base region 2a is inverted from P-type to N-type, to form a channel. Through this channel, electrons are injected from the emitter electrode 9 into the semiconductor layer 1. By the injected electrons, the region between the collector region 11 and the semiconductor layer 1 enters the forward bias state, and positive holes (holes) are injected from the collector region 11 into the semiconductor layer 1. This largely reduces the resistance of the semiconductor layer 1. Because of a large reduction in ON resistance of the semiconductor switching element, the current capacity increases. Further, by virtue of the charge storage layer 4 accumulating the positive holes supplied from the collector region 11 immediately under the charge storage layer 4, the effect of reducing ON resistance of the semiconductor switching element further intensifies.

Next, a description will be given of the operation when the semiconductor switching element according to the first preferred embodiment turns OFF from ON state. With reference to FIGS. 1 and 2, the gate voltage $V_{GE}$ applied across the emitter electrode 9 and the first gate electrodes 6a, and across the emitter electrode 9 and the second gate electrodes 6b is switched from positive to zero or negative (reverse bias). Thus, the channel region having been inverted to N-type recovers P-type, and the injection of electrons from the emitter electrode 9 to the semiconductor layer 1 stops. Because of the stop of electron injection, the injection of positive holes from the collector region 11 to the semiconductor layer 1 also stops. Thereafter, the electrons having been accumulated in the semiconductor layer 1 are collected by the collector electrode 12, and the positive holes accumulated in the semiconductor layer 1 are collected by the emitter electrode 9. Alternatively, they are recombined with each other and extinguished.

Here, since the predetermined positive collector voltage $V_{CE}$ is applied across the emitter electrode 9 and the collector electrode 12, the maximum electric field is applied to the PN junction part formed by the semiconductor layer 1 and the base regions 2a, and the bottom part of the second trenches 5b. Here, each charge storage layer 4 is interposed between the trenches provided at an interval of a predetermined distance or smaller and the charge storage layers 4 are not provided under the conductive regions 2b and, therefore, the charge storage layers 4 are depleted in the OFF state. Accordingly, the breakdown voltage of the element will not reduce when the collector voltage $V_{CE}$ is applied to the element.

Further, since each second trench 5b is smaller in depth than each first trench 5a, the PN junction part formed by the semiconductor layer 1 and the base regions 2a and the bottom part of the second trenches 5b approach each other. That is, the portions to which the maximum electric field is applied approach each other. This makes it easier to keep the electric field in balance and, therefore, a reduction in breakdown voltage at such portions is suppressed.

<Manufacturing Method>

FIGS. 4A to 14B are diagrams showing an exemplary method of manufacturing the semiconductor switching element according to the first preferred embodiment, and specifically are section views showing the state of the semiconductor switching element at corresponding stages in the manufacturing process. Note that, FIGS. 4A, 5A, 6A, 7A, 8A, 9A, 10A, 11A, 12A, 13A, and 14A show the section state taken along line A-A' in FIG. 1, and FIGS. 4B, 5B, 6B, 7B, 8B, 9B, 10B, 11B, 12B, 13B, and 14B show the section state taken along line B-B' in FIG. 1.

Figure 4A:
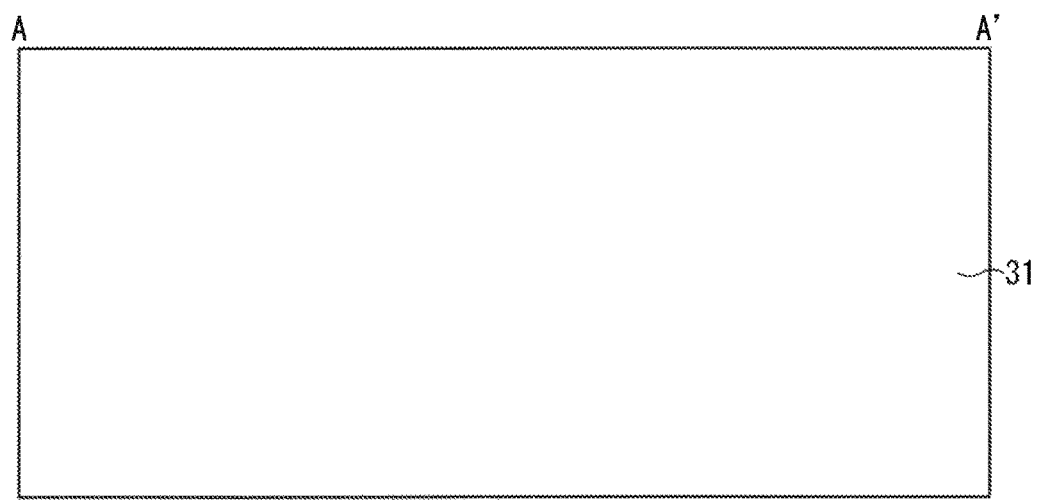
Figure 4B:
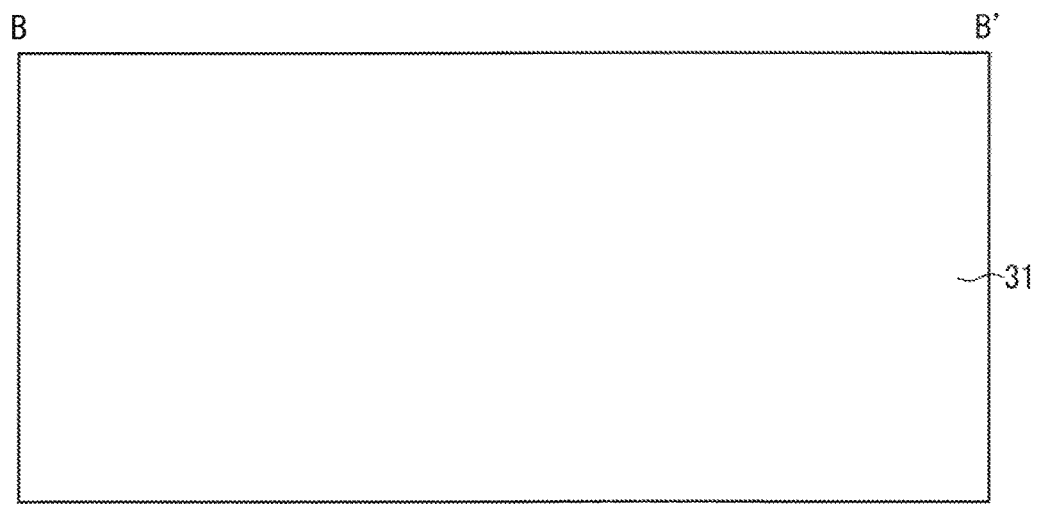

In the step shown in FIGS. 4A and 4B, a substrate 31 containing silicon of N⁻-type is provided. Note that, the substrate 31 may be a substrate that contains a wide-bandgap semiconductor such as, for example, gallium nitride and silicon carbide.

Figure 5A:
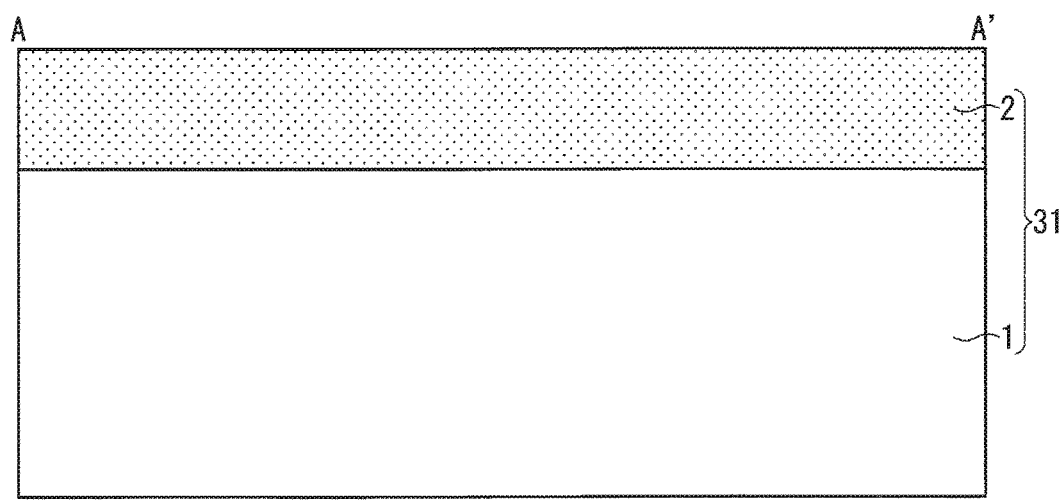
Figure 5B:
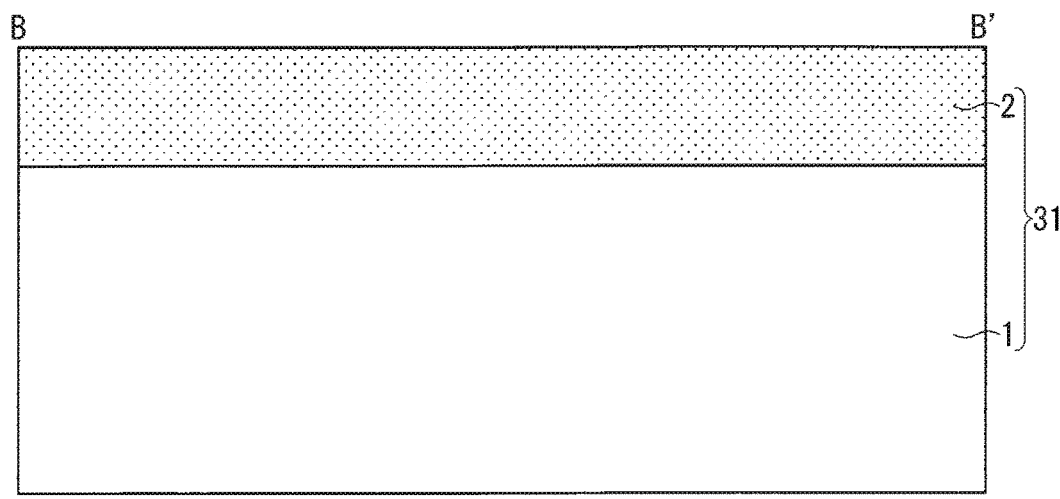

Next, in the step shown in FIGS. 5A and 5B, by diffusing a P-type impurity in the upper part of the substrate 31, a P-type region 2 is formed. The P-type region 2 ultimately substantially will be the base regions 2a and the conductive regions 2b. The portion in the substrate 31 other than the P-type region 2 ultimately substantially will be the semiconductor layer 1. Accordingly, hereinafter, the portion in the substrate 31 other than the P-type region 2 is referred to as the semiconductor layer 1.

Figure 6A:
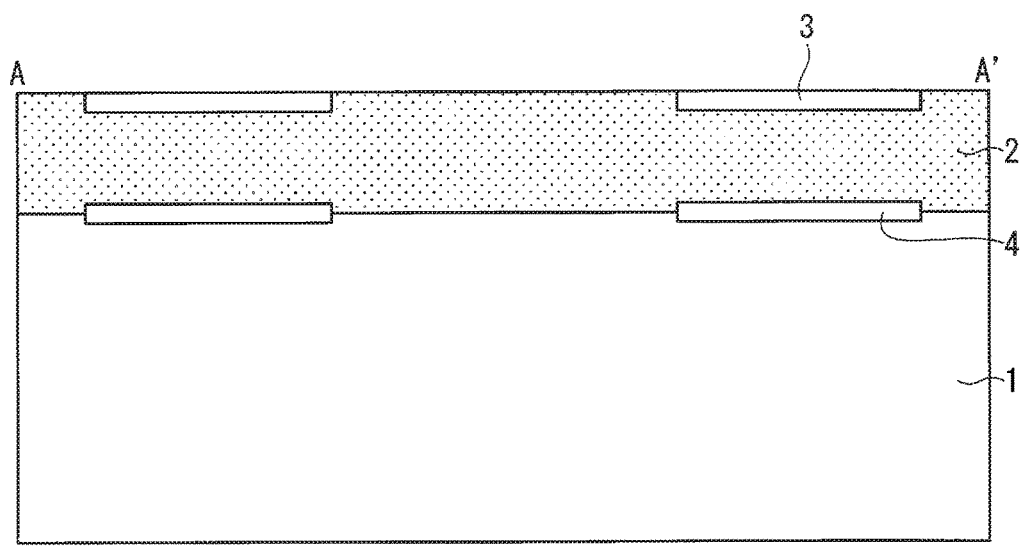
Figure 6B:
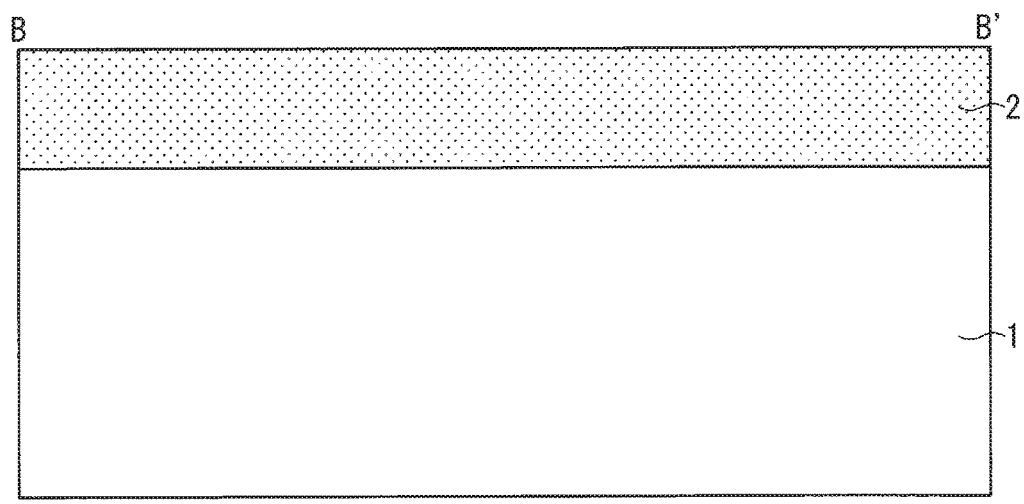

Then, in the step shown in FIGS. 6A and 6B, the emitter regions 3 are formed at part of the upper part of the P-type region 2, and the charge storage layers 4 are formed at part of the portion between the semiconductor layer 1 and the P-type region 2. At this time, since the pattern of the emitter regions 3 in a plan view and the pattern of the charge storage layers 4 in a plan view are the same, the emitter region 3 and the charge storage layer 4 can be formed almost simultaneously just by changing the accelerating voltage in injecting an impurity using the same photomask.

Figure 7A:
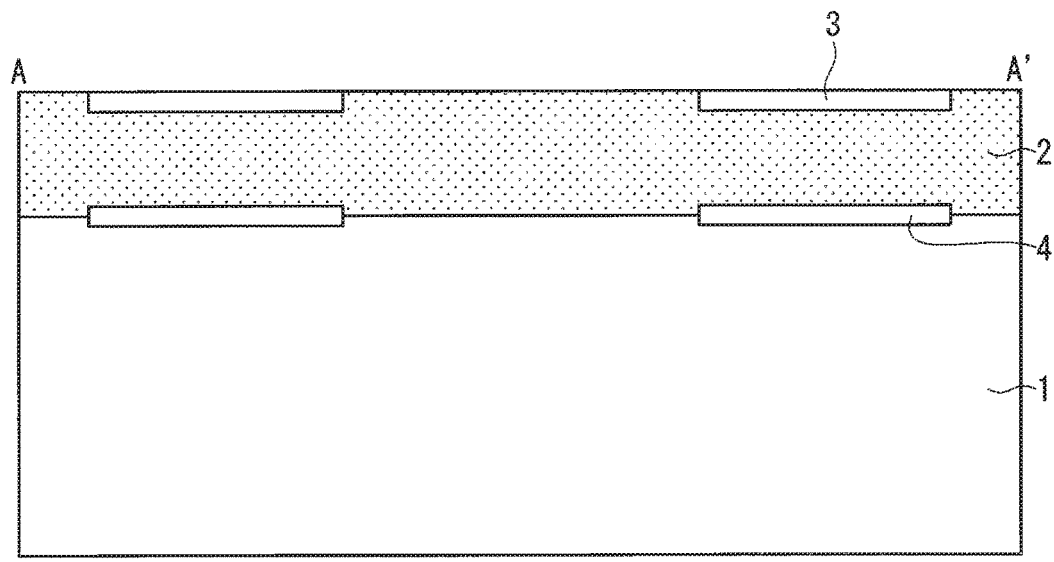
Figure 7B:
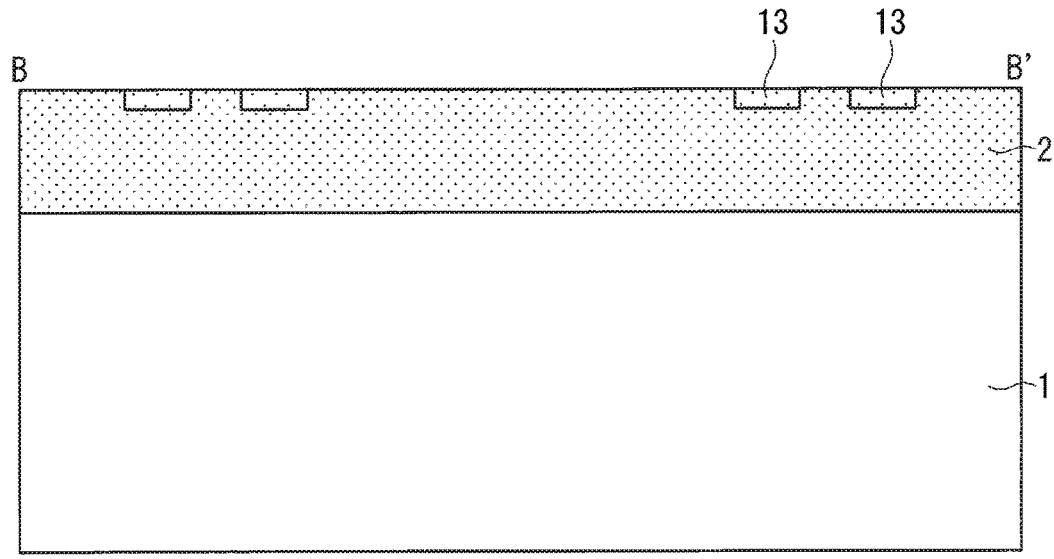

In the step shown in FIGS. 7A and 7B, the high-concentration regions 13 are formed at other part of the upper part of the P-type region 2.

Figure 8A:
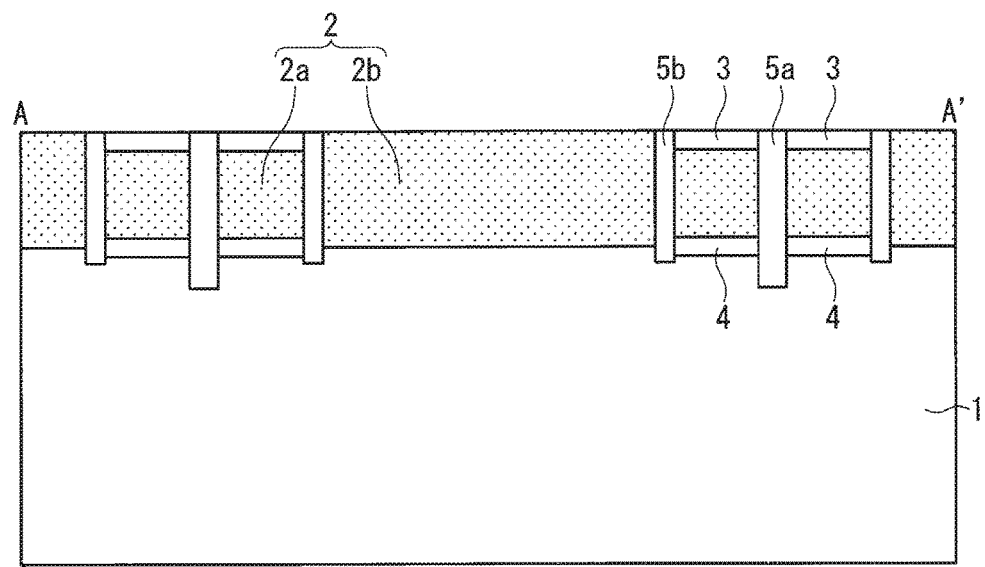
Figure 8B:
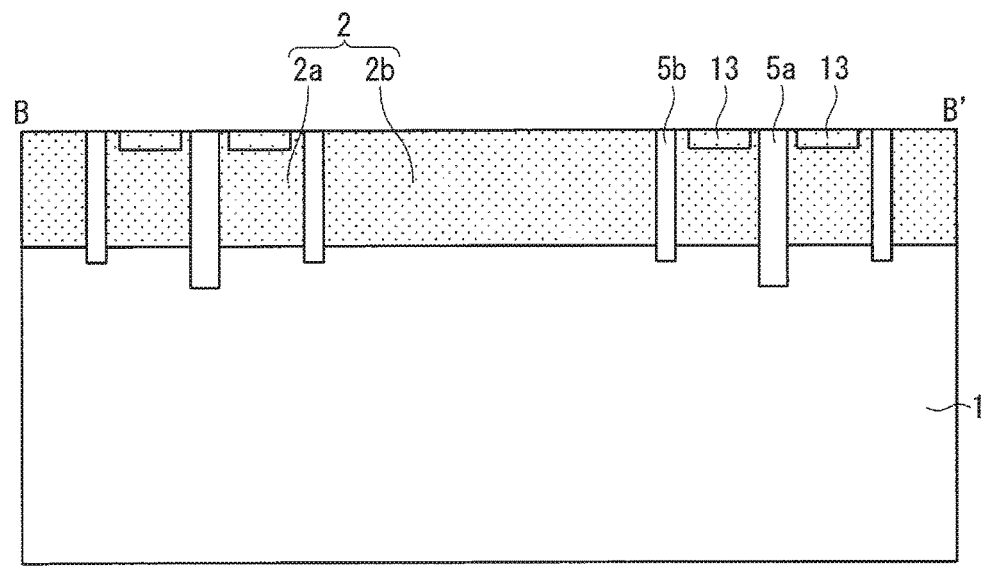

Next, in the step shown in FIGS. 8A and 8B, the first trenches 5a that penetrate through the emitter region 3, the P-type region 2, and the charge storage layer 4 are formed, and the second trenches 5b that is adjacent to the end of respective corresponding emitter regions 3 and penetrate through the P-type region 2 are formed. At this time, setting each second trench 5b to be narrower in width than each first trench 5a, the first and second trenches 5a, 5b being different in depth can be simultaneously formed by the same etching step by the microloading effect. As a result of forming the second trenches 5b, the P-type region 2 is separated into the base regions 2a and the conductive regions 2b. Note that, while the base regions 2a, the conductive regions 2b, the emitter regions 3, and the charge storage layers 4 are formed through the steps described above, the order of forming steps are not limited to the foregoing.

Figure 9A:
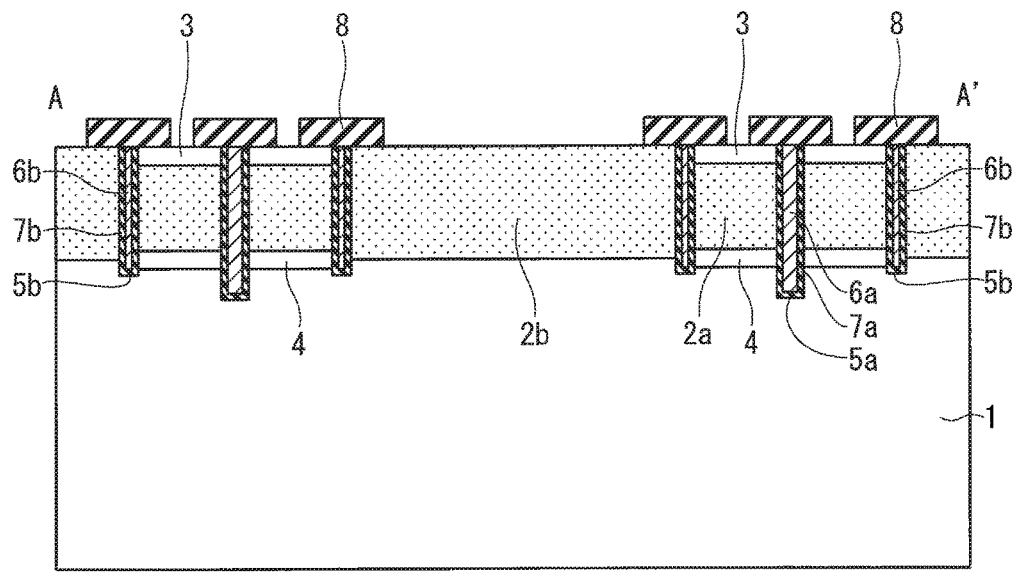
Figure 9B:
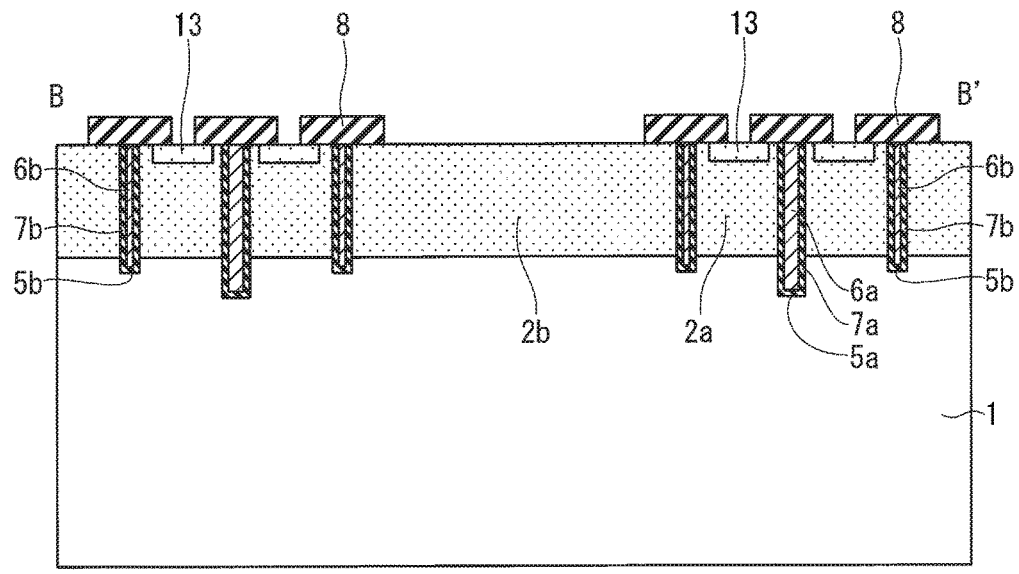

Then, in the step shown in FIGS. 9A and 9B, the first gate oxide film 7a is formed in each of the first trenches 5a, and the second gate oxide film 7b is formed in each of the second trenches 5b. Then, the first gate electrode 6a is embedded in each first trench 5a via the first gate oxide film 7a, and the second gate electrode 6b is embedded in each second trench 5b via the second gate oxide film 7b. Then, the insulating films 8 that cover the upper surface of the first and second gate electrodes 6a, 6b and the upper part around the first and second gate electrodes 6a, 6b are formed.

Figure 10A:
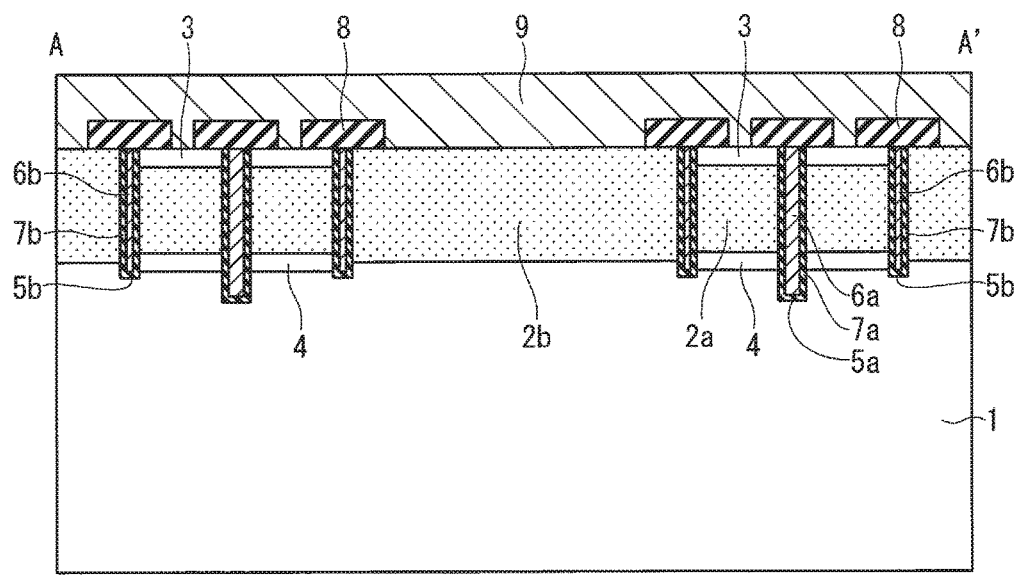
Figure 10B:
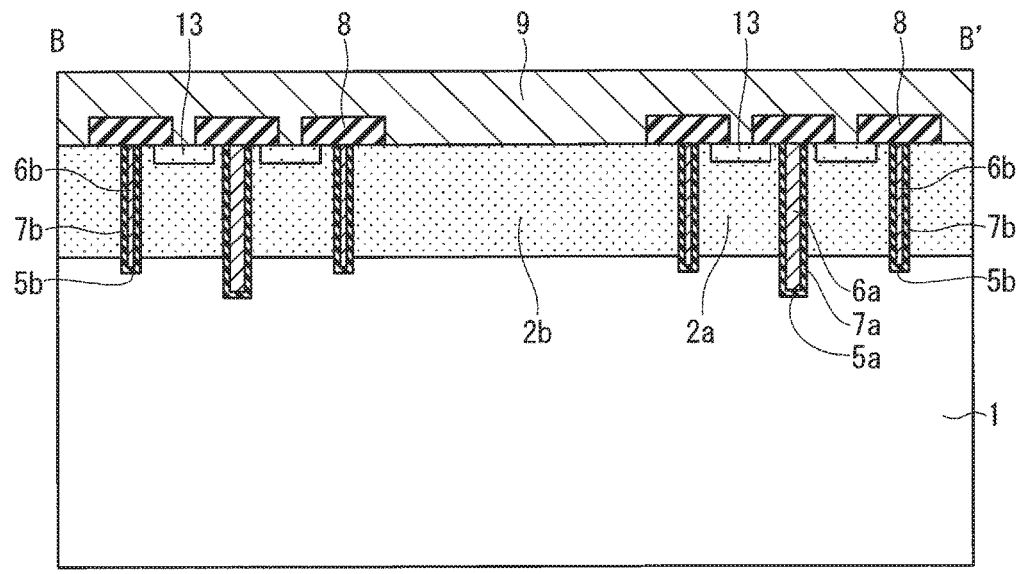

In the step shown in FIGS. 10A and 10B, the emitter electrode 9 that covers the portion exposed outside the insulating films 8 in the conductive regions 2b, the emitter regions 3, and the high-concentration region 13, and the insulating films 8 is formed.

Figure 11A:
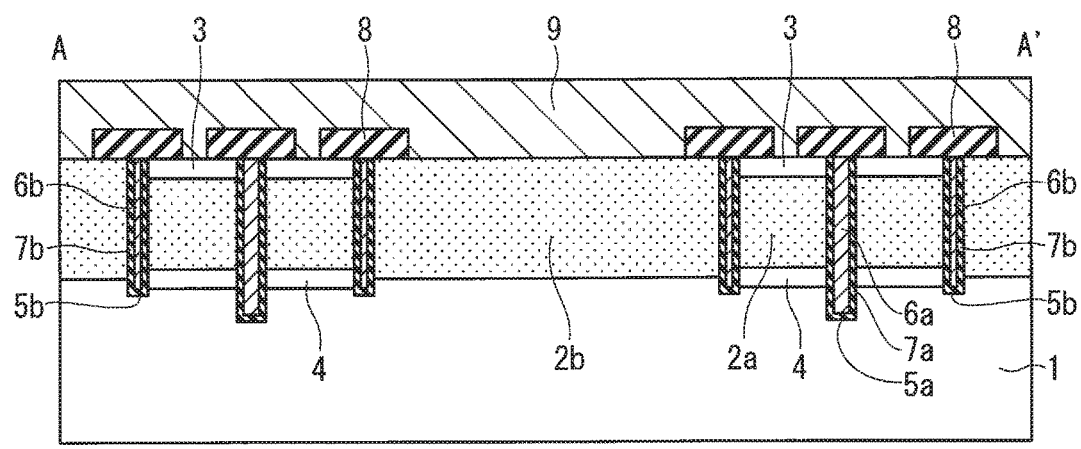
Figure 11B:
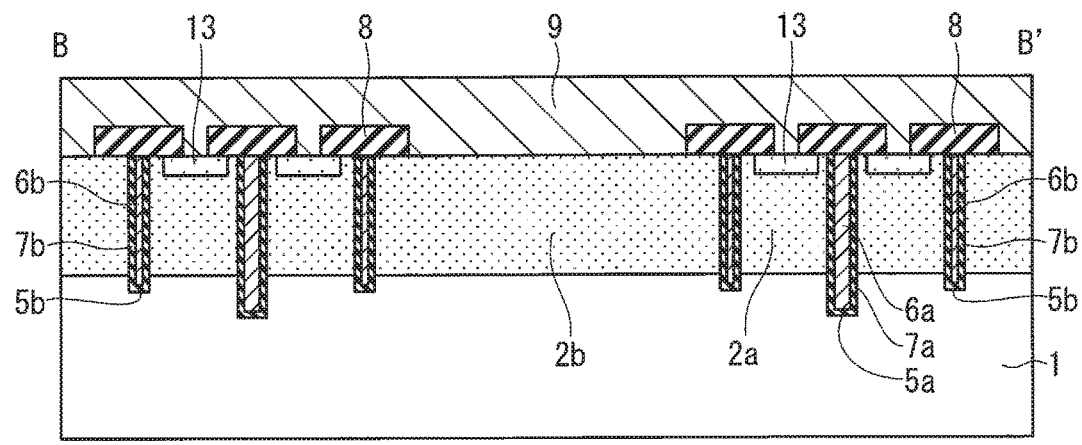
Figure 12A:
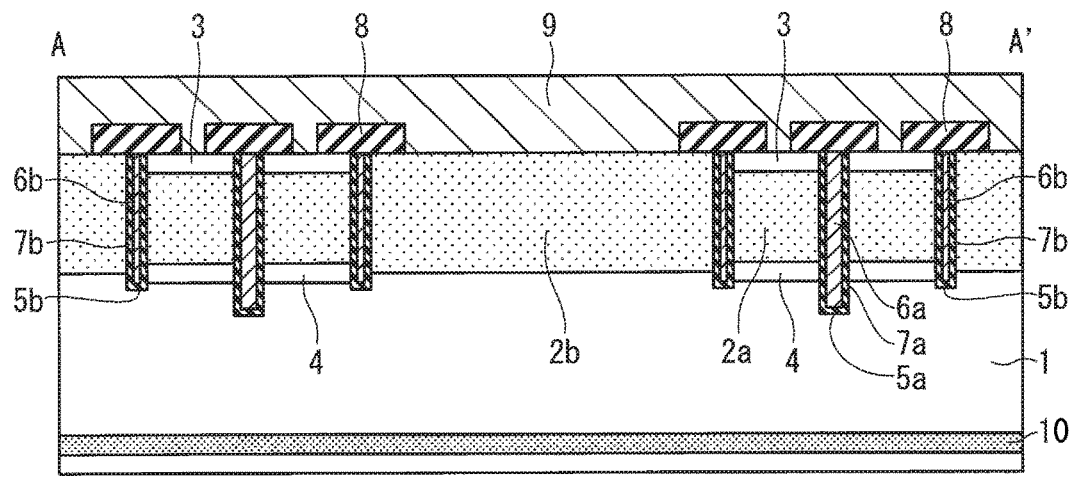
Figure 12B:
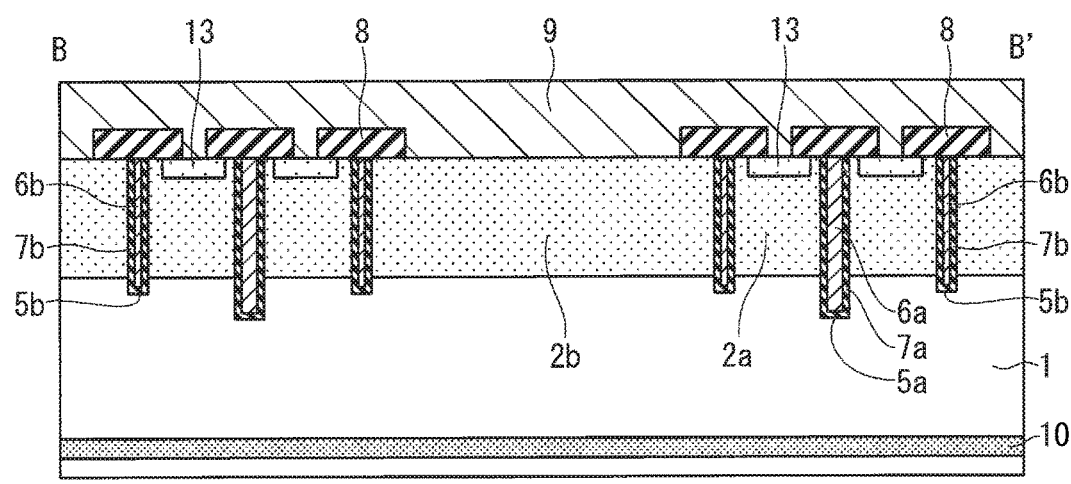
Figure 13A:
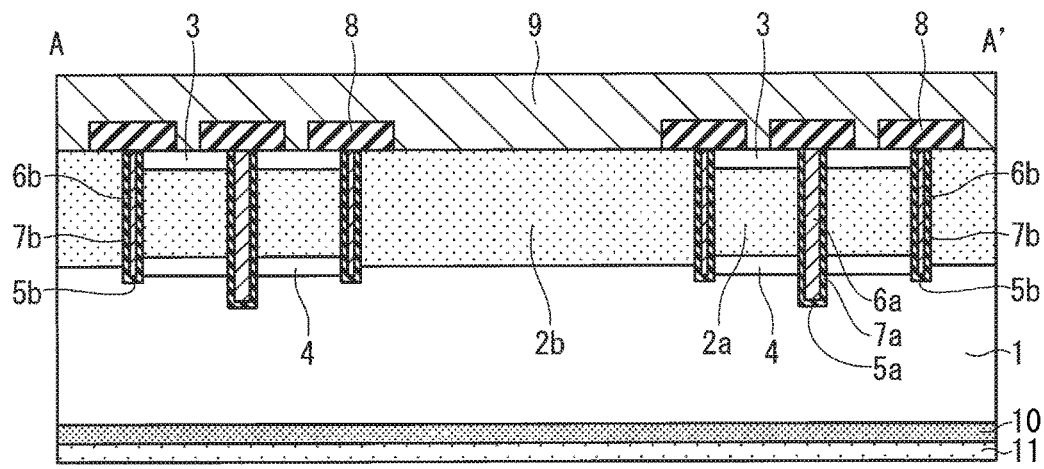
Figure 13B:
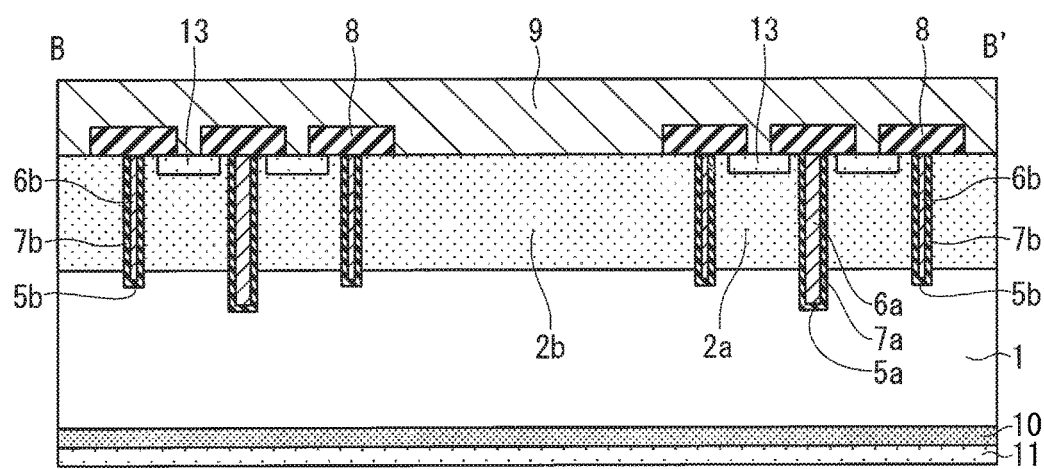

In the step show in FIGS. 11A and 11B, the back surface of the semiconductor layer 1 is polished, so that the thickness of the semiconductor layer 1 is adjusted to a predetermined thickness. Next, in the step shown in FIGS. 12A and 12B, the buffer region 10 is formed by a predetermined depth from the back surface of the semiconductor layer 1. Then, in the step shown in FIGS. 13A and 13B, the collector region 11 is formed on the lower surface of the buffer region 10. Finally, in the step shown in FIGS. 14A and 14B, the collector electrode 12 is formed on the lower surface of the collector region 11. Through the foregoing steps, the semiconductor switching element according to the first preferred embodiment shown in FIGS. 2 and 3 is obtained.

<Conclusion of First Preferred Embodiment>

The semiconductor switching element according to the first preferred embodiment having the structure described above is capable of suppressing a reduction in breakdown voltage in OFF state despite its structure corresponding to the second related semiconductor switching element shown in FIG. 23 from which the first gate electrodes 6a are partially omitted. Further, since the second trenches 5b are smaller in depth than the first trenches 5a, the PN junction part formed by the semiconductor layer 1 and the base regions 2a and the bottom part of the second trenches 5b approach each other. This makes it easier to keep the electric field in balance and, therefore, a reduction in breakdown voltage at such portions is suppressed. Further, by virtue of not providing the gate electrodes in the conductive regions 2b, the parasitic capacitance of the element can be reduced.

As a result, it becomes possible to suppress an increased current that flows through the gate and to suppress a reduction in the switching speed.

Modification of First preferred Embodiment

Figure 15:
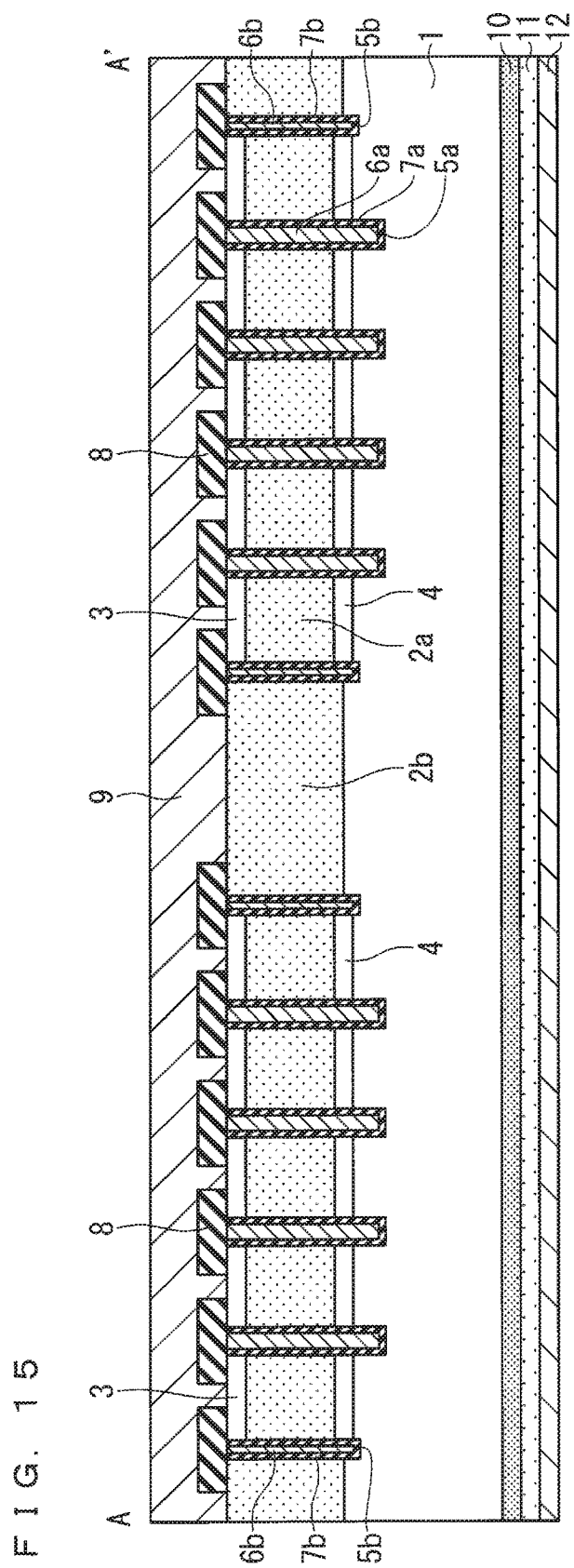
FIG. 15 is a section view taken along line A-A' showing the structure of a semiconductor switching element according to a modification of the first preferred embodiment.

FIG. 15 is a section view taken along line A-A' showing the structure of a semiconductor switching element according to a modification of the first preferred embodiment. As shown in FIG. 15, the number of the base regions 2a, the emitter regions 3, the first trenches 5a, the first gate electrodes 6a, and the first gate oxide films 7a between the two conductive regions 2b may be greater than that in the first preferred embodiment. This structure also is capable of suppressing a reduction in breakdown voltage, similarly to the first preferred embodiment.

Figure 16:
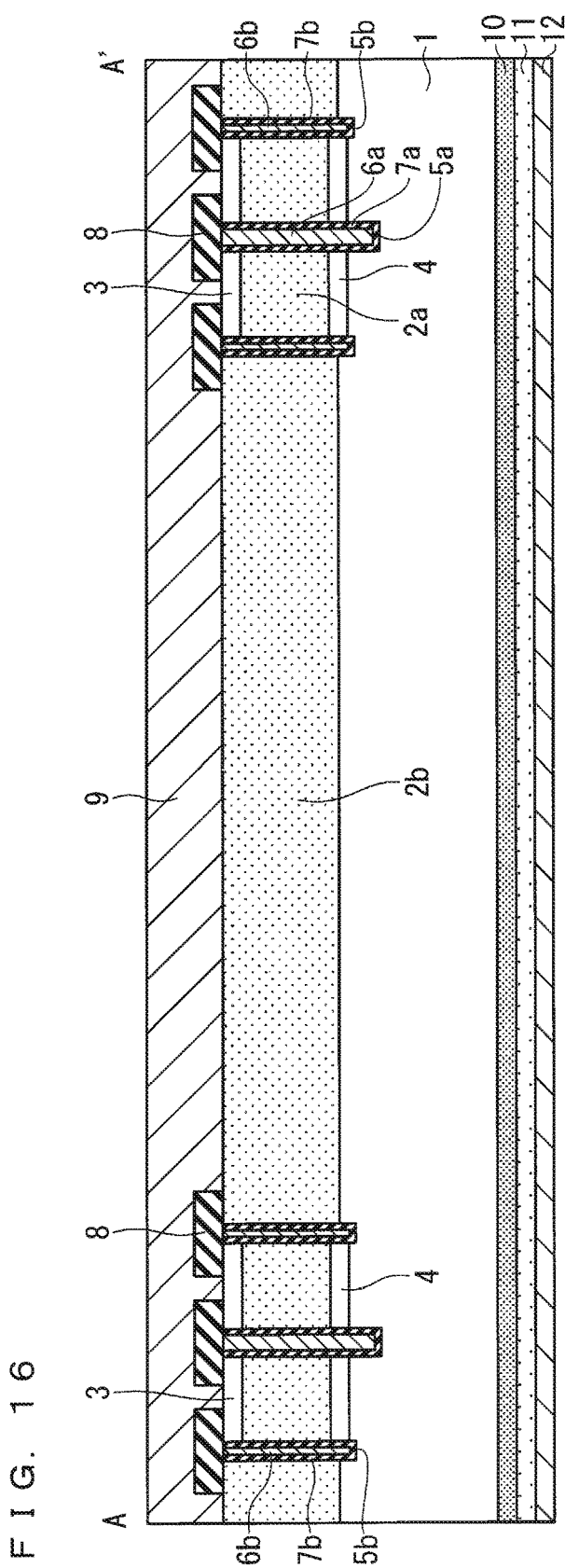
FIG. 16 is a section view taken along line A-A' showing the structure of a semiconductor switching element according to other modification of the first preferred embodiment.

FIG. 16 is a section view taken along line A-A' showing the structure of a semiconductor switching element according to other modification of the first preferred embodiment. As shown in FIG. 16, each conductive region 2b may be greater in width than each conductive region 2b according to the first preferred embodiment. This structure also is capable of suppressing a reduction in breakdown voltage, similarly to the first preferred embodiment.

Note that, the above-described modifications are also applicable to the second preferred embodiment which will be described below.

<Second Preferred Embodiment>

Figure 17:
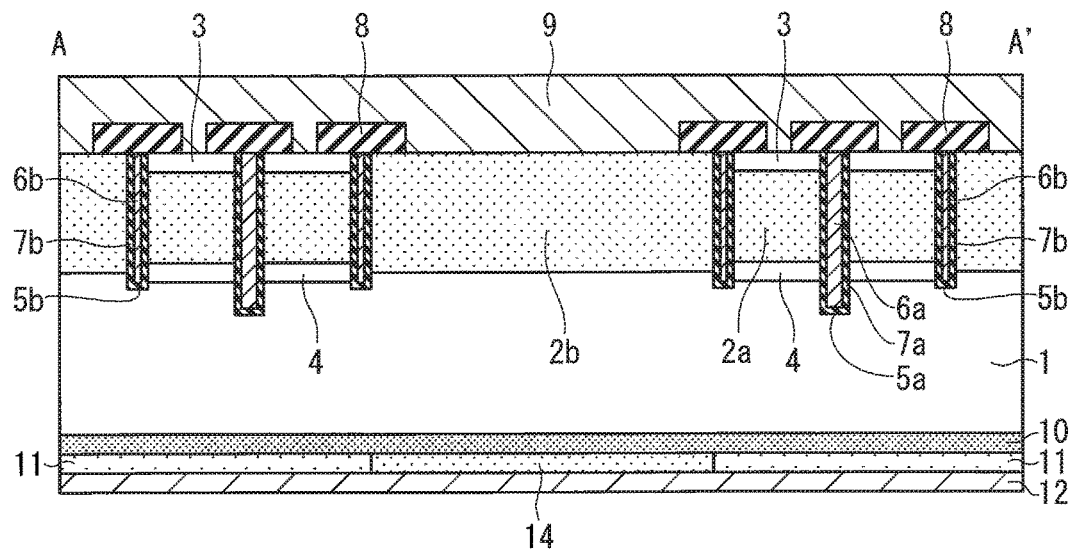
FIG. 17 is a section view taken along line A-A' showing the structure of a semiconductor switching element according to a second preferred embodiment.
Figure 18:
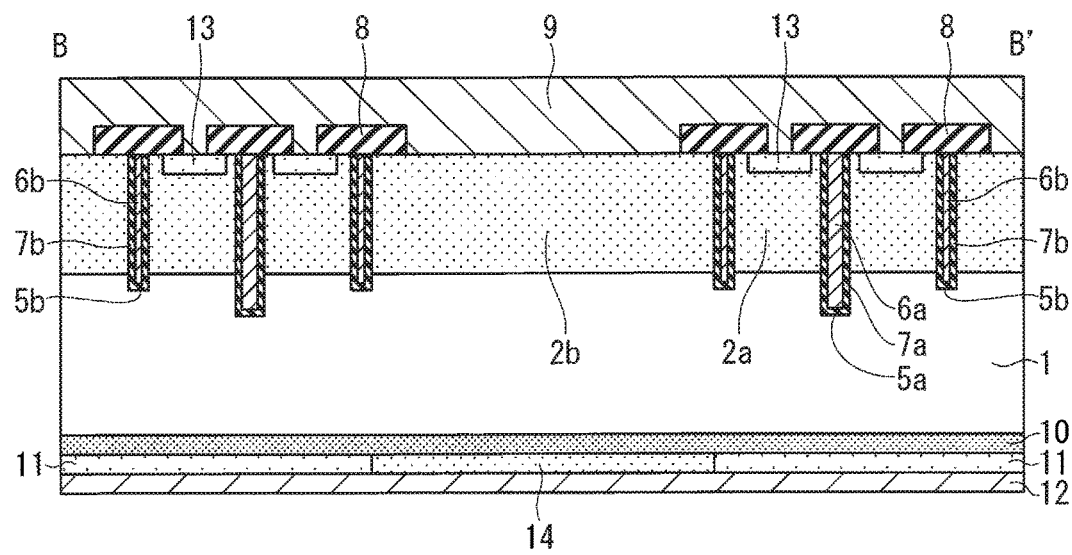
FIG. 18 is a section view taken along line B-B' showing the structure of the semiconductor switching element according to the second preferred embodiment.

The planar structure of a semiconductor switching element according to a second preferred embodiment of the present invention is similar to the planar structure of the semiconductor switching element according to the first preferred embodiment (FIG. 1). FIGS. 17 and 18 are respectively section views taken along line A-A' and line B-B' in FIG. 1. Hereinafter, as to the constituents of the second preferred embodiment, those identical or similar to the above-described constituents are denoted by the identical reference characters, and the description will be mainly given of different constituents.

As show in FIGS. 17 and 18, the semiconductor switching element according to the second preferred embodiment includes, in addition to the constituents of the semiconductor switch element according to the first preferred embodiment, a cathode region 14 being N-type. The cathode region 14 is a region formed by an N-type impurity, and provided below the conductive region 2b and the semiconductor layer 1.

In the second preferred embodiment, the cathode region 14 is disposed immediately below the conductive region 2b and on the lower surface of the buffer region 10. The side portions of the cathode region 14 are respectively adjacent to the collector regions 11. Note that, the cathode region 14 may not be provided below every conductive region 2b, and may be provided below at least one conductive region 2b. The semiconductor switching element according to the second preferred embodiment having such a structure functions as a reverse-conducting insulated gate transistor. As used herein, the reverse-conducting insulated gate transistor includes the carrier stored insulated gate bipolar transistor described in the first preferred embodiment, and a freewheeling diode. Further, the freewheeling diode herein includes the cathode region 14 and the conductive region 2b above this cathode region 14.

<Operation>

A description will be given of an operation of the semiconductor switching element according to the second preferred embodiment. Note that, the operation of the carrier stored insulated gate bipolar transistor in the semiconductor switching element according to the second preferred embodiment is the same as the operation described in the first preferred embodiment. In the following, a description will be given of the operation of the freewheeling diode in the semiconductor switching element according to the second preferred embodiment.

In the structure of FIGS. 17 and 18, when a forward bias (anode voltage VAK) exceeding a predetermined threshold value is applied across the emitter electrode 9 and the collector electrode 12, positive holes are injected from the conductive region 2b into the semiconductor layer 1. Further, electrons are injected from the cathode region 14 into the semiconductor layer 1. Thus, the forward voltage (VF) largely reduces. As a result, current flows between the emitter electrode 9 and the collector electrode 12. Here, with the semiconductor switching element according to the second preferred embodiment, the charge storage layers 4 are not disposed immediately above the cathode region 14. Accordingly, since the electrons supplied from the cathode region 14 are not blocked by the charge storage layers 4, a further lower forward voltage is obtained.

<Manufacturing Method>

Figure 19A:
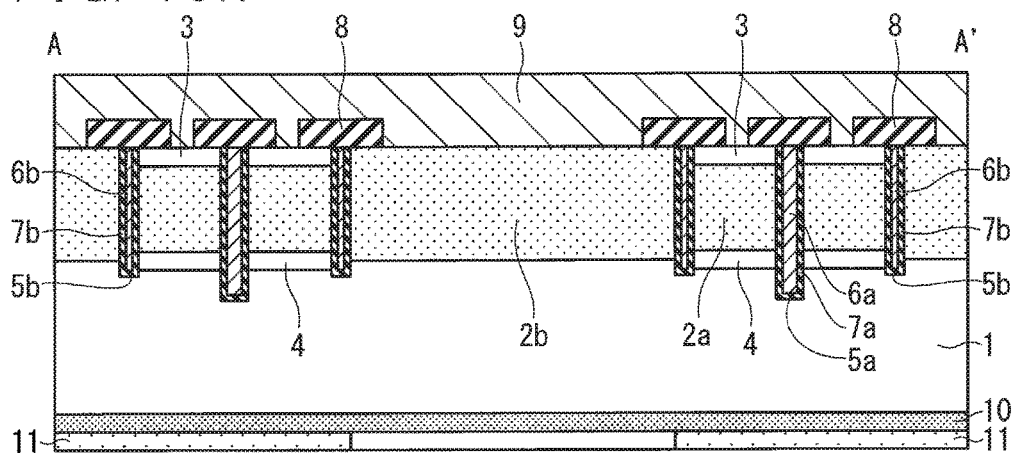
FIGS. 19A to 21B are each a section view showing a method of manufacturing the semiconductor switching element according to the second preferred embodiment.

FIGS. 19A to 21B are diagrams showing an exemplary method of manufacturing the semiconductor switching element according to the second preferred embodiment, and specifically are section views showing the state of the semiconductor switching element at corresponding stages in a part of the manufacturing process. Note that, FIGS. 19A, 20A, and 21A show the section state taken along line A-A' in FIG. 1, and FIGS. 19B, 20B, and 21B show the section state taken along line B-B' in FIG. 1.

Firstly, the steps described in the first preferred embodiment with reference to FIGS. 4A and 4B to FIGS. 12A and 12B are performed.

Figure 19B:
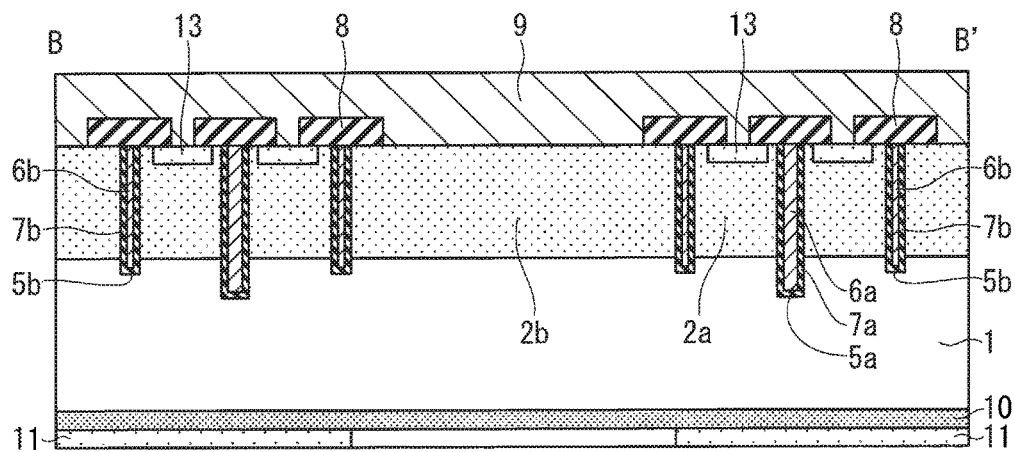
Figure 20A:
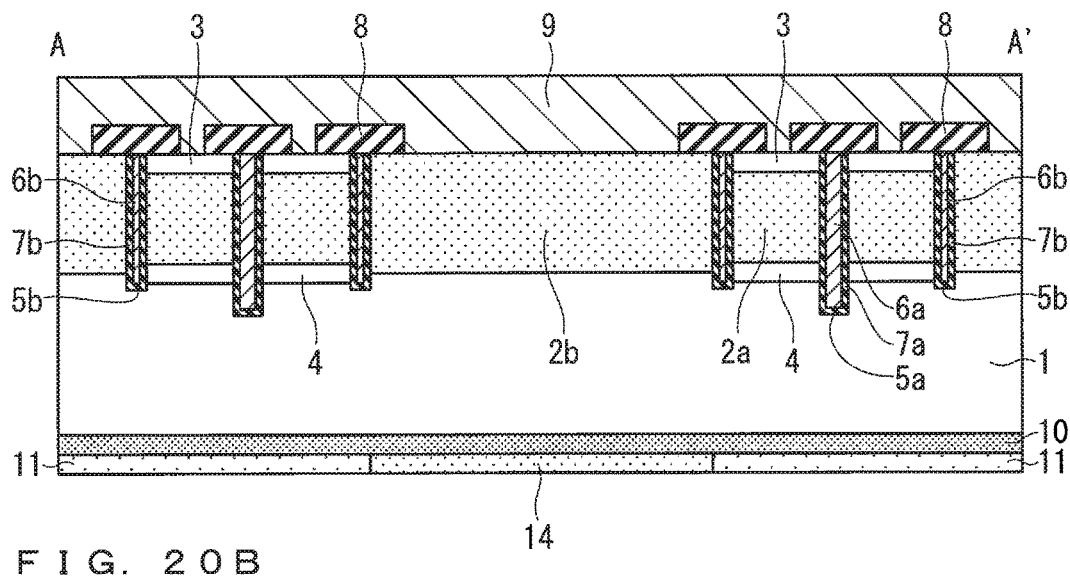
Figure 20B:
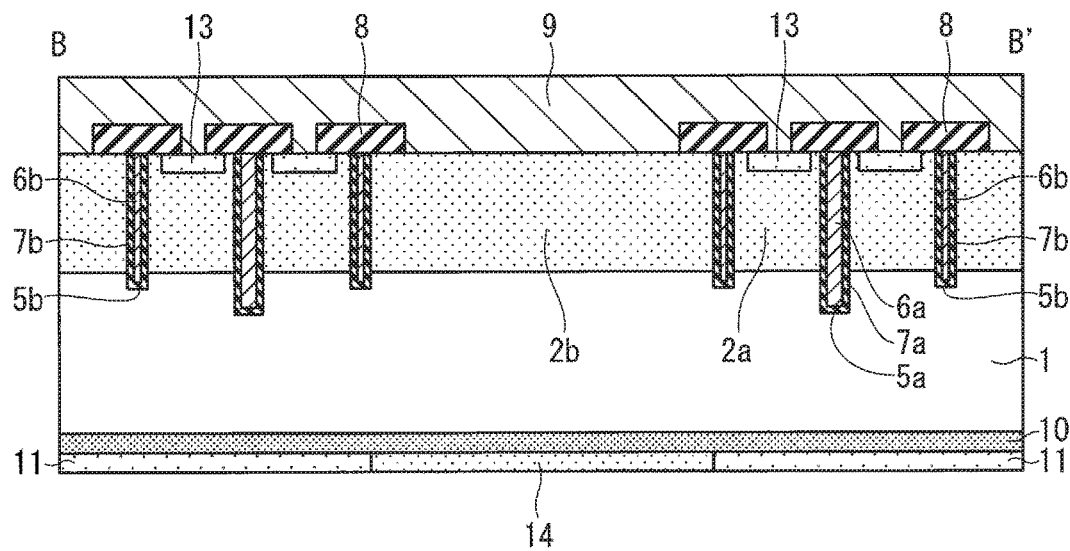
Figure 21A:
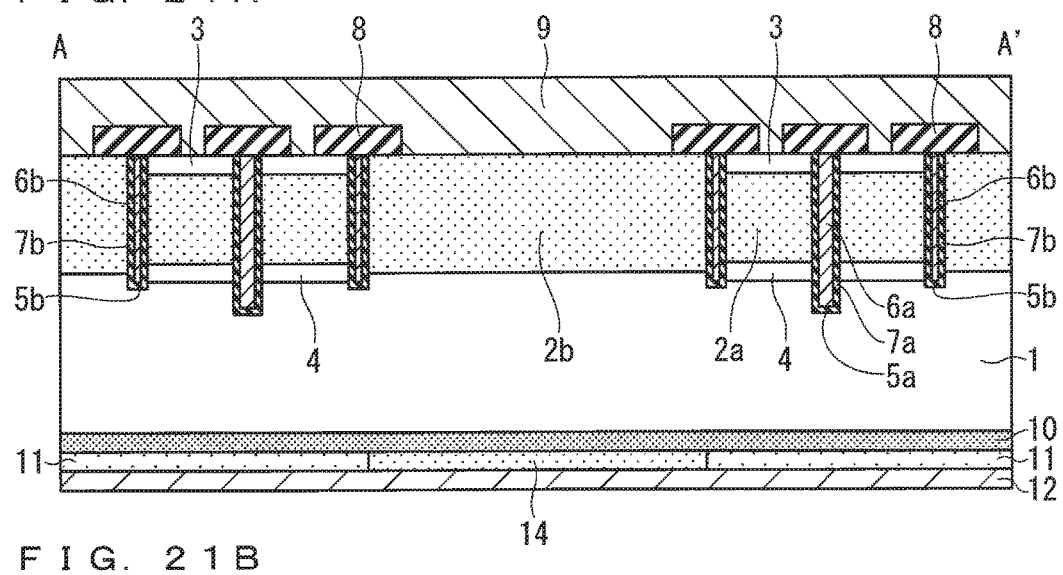
Figure 21B:
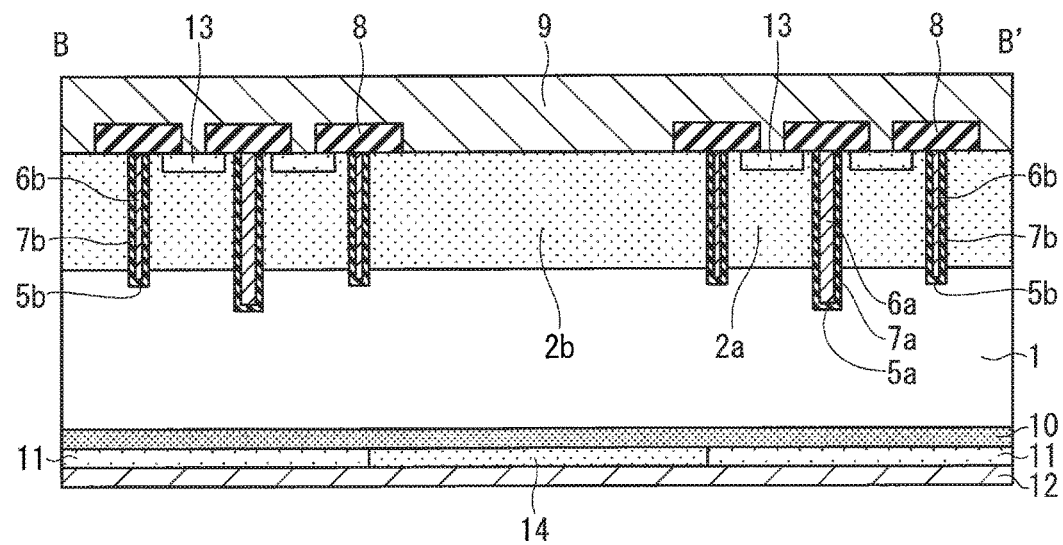

Next, in the step shown in FIGS. 19A and 19B, the collector regions 11 are formed on the lower surface of the buffer region 10 avoiding the region immediately below the conductive region 2b. Then, in the step shown in FIGS. 20A and 20B, the cathode region 14 is formed immediately below the conductive region 2b and on the lower surface of the buffer region 10. Finally, in the step shown in FIGS. 21A and 21B, the collector electrode 12 is formed on the lower surface of the collector regions 11 and the cathode region 14. Through the foregoing steps, the semiconductor switching element according to the second preferred embodiment shown in FIGS. 17 and 18 is obtained.

<Conclusion of Second Preferred Embodiment>

Similarly to the first preferred embodiment, the semiconductor switching element according to the second preferred embodiment having the above-described structure can suppress a reduction in breakdown voltage and reduce the parasitic capacitance of the element. Further, the cathode region 14 is provided at the region immediately below the conductive region 2b where the charge storage layers 4 are not provided, and below the semiconductor layer 1. Accordingly, since the electrons supplied from the cathode region 14 are not blocked by the charge storage layers 4, a further lower forward voltage (VF) is obtained.

Note that, the preferred embodiments of the present invention can be freely combined, modified, or omitted within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor switching element comprising:
 a semiconductor layer being a first conductivity type;
 plural charge storage layers disposed on first planes in an upper surface of said semiconductor layer;
 plural base regions being a second conductivity type and disposed on said charge storage layers;
 plural emitter regions being the first conductivity type and disposed on said base regions;
 plural conductive regions being the second conductivity type and disposed on second planes in the upper surface of said semiconductor layer;
 a repeating pattern of at least one first gate electrode between two second gate electrodes;
 regions of second conductivity type having a higher impurity concentration than said base regions and separating said plural emitter regions from each other in a plan view in cooperation with said base regions, wherein
 the first gate electrode is disposed, via a first gate insulating film, inside a first trench that extends from an upper surface of said emitter regions to reach said semiconductor layer, and intersects with one of said plural emitter regions, one of said plural base regions, and one of said plural charge storage layers,
 each second gate electrode is disposed, via a second gate insulating film, inside a second trench that extends from the upper surface of one of said emitter regions and an upper surface of one of said conductive regions to reach said semiconductor layer, and is adjacent to one of said emitter regions, one of said base regions, one of said charge storage layers, and one of said conductive regions,
 each said second trench is smaller in depth than said first trench, and each said second trench is smaller in width than said first trench,
 said plural emitter regions and said plural charge storage layers correspond to each other in a pattern in a plan view, and
 a gate voltage is applied to said at least one first gate electrode and said second gate electrodes.

2. The semiconductor switching element according to claim 1, further comprising a cathode region being the first conductivity type and disposed below one of said conductive regions and said semiconductor layer.

3. A method of manufacturing a semiconductor switching element, comprising:
 (a) forming
  plural charge storage layers disposed on first planes in an upper surface of a semiconductor layer being a first conductivity type,
  plural base regions being a second conductivity type and formed on said charge storage layers,
  plural emitter regions being the first conductivity type and disposed on said base regions, and
  plural conductive regions being the second conductivity type and disposed on second planes in an upper surface of the said semiconductor layer;
 (b) forming
  plural first trenches extending from an upper surface of said emitter regions to reach said semiconductor layer, and intersecting with one of said plural emitter regions, one of said plural base regions, and one of said plural charge storage layers, and
  plural second trenches, each said second trench extending from the upper surface of one of said emitter regions and an upper surface of one of said conductive regions to reach said semiconductor layer, and being adjacent to one of said emitter regions, one of said base regions, one of said charge storage layers, and one of said conductive regions;

(c) forming first gate electrodes inside said first trenches, respectively, via first gate insulating films, and second gate electrodes, respectively, inside said second trenches via second gate insulating films;

(d) forming regions of second conductivity type having a higher impurity concentration than said base regions and separating said plural emitter regions from each other in a plan view in cooperation with said base regions, wherein said plural second trenches are smaller in depth than said plural first trenches, and said plural second trenches are smaller in width than said plural first trenches, said first gate electrodes and said second gate electrodes are formed in a repeating pattern of a first gate electrode between two second gate electrodes, said plural emitter regions and said plural charge storage layers correspond to each other in a pattern in a plan view, and a gate voltage is applied to said first gate electrodes and said second gate electrodes.

4. The method of manufacturing a semiconductor switching element according to claim 3, further comprising (e) forming a cathode region being the first conductivity type below one of said conductive regions and said semiconductor layer.

* * * * *